(12) United States Patent
Kim et al.

(10) Patent No.: US 6,406,955 B1
(45) Date of Patent: Jun. 18, 2002

(54) METHOD FOR MANUFACTURING CMOS DEVICES HAVING TRANSISTORS WITH MUTUALLY DIFFERENT PUNCH-THROUGH VOLTAGE CHARACTERISTICS

(75) Inventors: Dong-jun Kim, Suwon; Jeong-hyuk Choi, Seocho-gu, both of (KR)

(73) Assignee: Samsung Electronics Co., LTD (KR)

( * ) Notice: Subject to any disclaimer, the term of this patent is extended or adjusted under 35 U.S.C. 154(b) by 0 days.

(21) Appl. No.: 09/566,918

(22) Filed: May 9, 2000

Related U.S. Application Data

(62) Division of application No. 08/443,283, filed on May 17, 1995, now Pat. No. 6,091,116.

(30) Foreign Application Priority Data

May 17, 1994 (KR) ............................................. 94-10776

(51) Int. Cl.⁷ ......................................... H01L 21/8238
(52) U.S. Cl. ...................... 438/199; 438/217; 438/223
(58) Field of Search ................................ 438/199, 202, 438/209, 217, 223, 224, 227, 228, 231, 232, 234, 282; 257/204, 338, 351, 369, 371, 401

(56) References Cited

U.S. PATENT DOCUMENTS

| | | | | |
|---|---|---|---|---|
| 4,716,451 A | | 12/1987 | Hsu et al. ................... 257/371 |
| 4,907,058 A | | 3/1990 | Sakai ........................... 257/371 |
| 4,987,089 A | * | 1/1991 | Roberts ....................... 438/202 |
| 5,124,271 A | * | 6/1992 | Havemann ................... 438/703 |
| 5,234,847 A | * | 8/1993 | Iranmanesh ................. 438/202 |
| 5,283,200 A | * | 2/1994 | Okamoto ..................... 438/217 |
| 5,290,714 A | * | 3/1994 | Onozawa .................... 438/207 |
| 5,362,981 A | | 11/1994 | Sato et al. .................. 257/371 |
| 5,384,279 A | * | 1/1995 | Stolmeijer et al. .......... 438/217 |
| 5,548,148 A | | 8/1996 | Bindal ......................... 257/402 |

FOREIGN PATENT DOCUMENTS

EP          0091256          10/1983

\* cited by examiner

*Primary Examiner*—Olik Chaudhuri
*Assistant Examiner*—Hoai Pham
(74) *Attorney, Agent, or Firm*—Pillsbury Winthrop LLP

(57) ABSTRACT

A CMOS device which includes first and second wells formed in first and second regions of a semiconductor substrate, respectively, first and second transistors formed in the respective wells, a third transistor formed in a third region of the semiconductor substrate outside of the wells, a first impurity layer formed in the vicinity of the depletion region of at least one but not more than two of the first, second, and third regions, and a second impurity layer deeper than the first impurity layer and formed in the region(s) of the substrate in which the first impurity layer is not formed. A method for manufacturing such a CMOS device enables the punch-through voltage characteristics of the first, second, and third transistors to be optimally different, without necessitating any additional, separate mask processing steps.

10 Claims, 8 Drawing Sheets

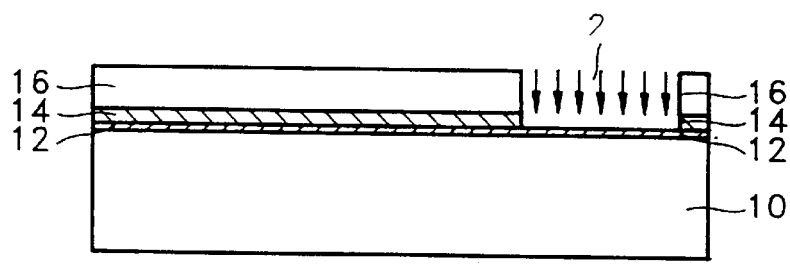
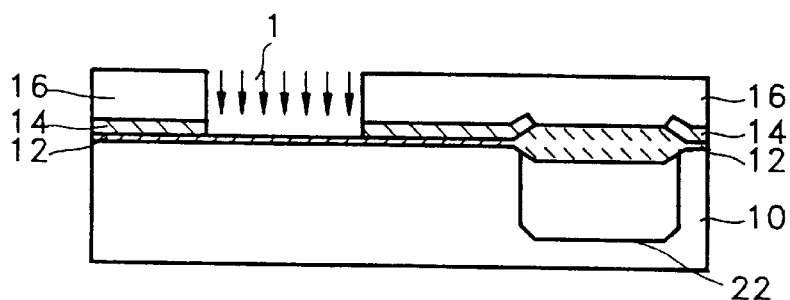
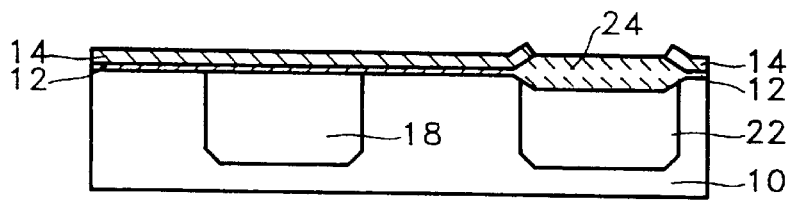
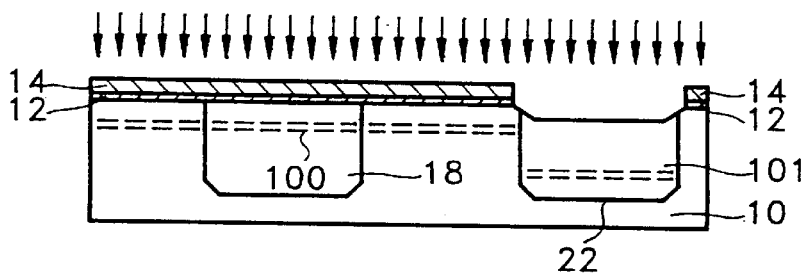
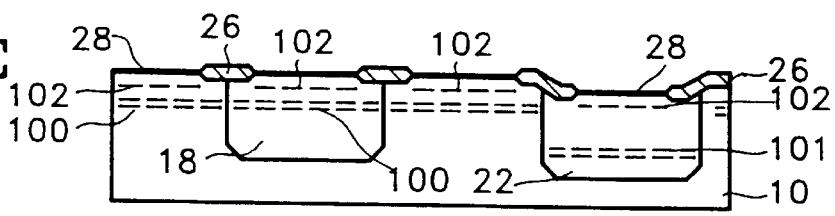
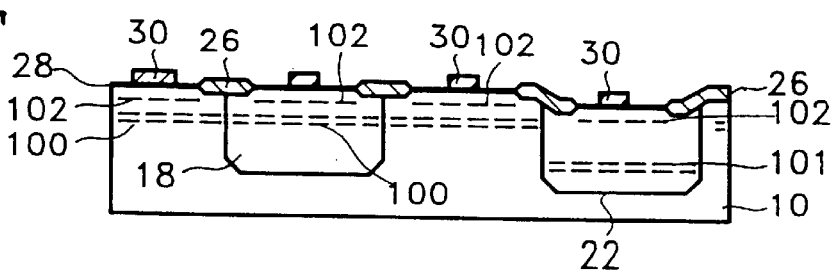

METHOD FOR MANUFACTURING CMOS DEVICES HAVING TRANSISTORS WITH MUTUALLY DIFFERENT PUNCH-THROUGH VOLTAGE CHARACTERISTICS

This is a division of application Ser. No. 08/443,283, filed May. 17, 1995 now U.S. Pat. No. 6,091,116.

BACKGROUND OF THE INVENTION

The present invention relates generally to semiconductor devices, and, more particularly, to CMOS devices having transistors with mutually different punch-through voltage characteristics less susceptible to punch-through, and a method for manufacturing the same.

A CMOS device is generally-produced by forming PMOS and NMOS transistors in a semiconductor substrate, and electrically connecting them. Conventionally, after forming an N-well and P-well in the substrate, transistors having opposite conductivities are formed simultaneously in the wells and in the substrate between the wells, to thereby complete the CMOS device.

FIG. 1 depicts a CMOS device manufactured by a conventional method, the CMOS device including a P-type semiconductor substrate 10, an N-well 18, a P-well 22, a field oxide layer 26, a gate oxide layer 28, and gate electrodes 30. The CMOS device depicted in FIG. 1 is formed by the steps of selectively doping opposite conductivity-type impurities in spaced-apart surface regions of the semiconductor substrate 10, to thereby form the N-well 18 and the P-well 22, respectively, forming the field oxide layer 26 in the conventional manner, forming the gate oxide layer 26 on the surface of the resultant structure, and forming the gate electrodes 30 on the gate oxide layer 28.

As semiconductor devices become more highly integrated, the unit size of the constituent devices thereof decreases, thus commensurately degrading the electrical characteristics of each constituent device. For example, in the case of a transistor, if the gap (channel) between the source and drain thereof is reduced, the incidence of punch-through due to contact between source and drain depletion regions thereof increases.

The lower the impurity concentration of the substrate, the more frequently punch-through occurs. The incidence of punch-through is particularly high in very small scale transistors, because a lower impurity concentration in the vicinity of the source and drain depletion regions and the substrate translates into larger source/drain depletion regions.

Significant research into a method for increasing the punch-through voltage of a transistor by increasing the impurity concentration in the vicinity of the source and drain depletion regions thereof has been actively carried out. In this connection, U.S. Pat. No. 4,354,307, entitled "Method for mass producing miniature field effect transistors in high density LSI/VLSI chips", issued to Vinson et al., discloses a method for increasing the punch-through voltage rating of a transistor by selectively increasing the impurity concentration of the substrate. However, since the bulk concentrations of the wells and the substrate which crucially influence electrical characteristics of transistors respectively formed in the wells and the substrate are not selectively adjusted for each transistor, it is difficult to achieve the different electrical characteristics required for each transistor.

For example, if the transistor formed in the substrate requires a specific punch-through voltage and the transistor formed in the well requires a back-bias at a given operating voltage, the transistor formed in the substrate should have a high punch-through voltage, which is generally attained by increasing the bulk concentration of the depletion region thereof. Further, as suggested by the following equation (1), the transistor formed in the well should have a low gamma ($\gamma$) value, which represents the variation of threshold voltage due to back-biasing>

$$\gamma = (2\epsilon_s \epsilon_0 q N_a)^{1/2}/C_{ox}, \qquad (1)$$

where $C_{ox}$ is the capacitance of the gate oxide layer 28, $\epsilon_s$ is the dielectric constant of the semiconductor substrate 10, $\epsilon_0$ is the dielectric constant of a vacuum, q is the charge quantity, and $N_a$ is the number of impurities. As can be understood from the above equation (1), in order to lower the $\gamma$ value, the value of $qN_a$ (i.e., bulk concentration) must be lowered. That is, when the transistor formed in the substrate requires a particular punch-through voltage and the transistor formed in the well requires reduced back biasing at a given operating voltage, the bulk concentration in the well should be different from that in the substrate.

However, using the conventional technique in which the respective bulk concentrations are not independently adjusted, it is not possible to manufacture transistors having mutually desirable characteristics at the same time. Rather, in order to achieve the required independent adjustment of the bulk concentrations, separate mask processing steps must be performed, which increases the cost and complexity, and reduces the efficiency and reliability of the manufacturing process.

Based on the above, it can be appreciated that there presently exists a need in the art for a CMOS device, and a method for manufacturing the same, which overcomes the above-described drawbacks and shortcomings of the presently available technology.

SUMMARY OF THE INVENTION

It is an object of the present invention to provide a CMOS device having transistors with mutually different punch-through voltage characteristics, simultaneously formed in a well and a substrate, respectively.

It is another object of the present invention to provide a method for manufacturing such a CMOS device.

The present invention encompasses a CMOS device which includes first and second wells formed in respective first and second regions of a semiconductor substrate, first and second transistors formed in the respective first and second regions, a third transistor formed in a third region of the substrate outside of the first and second wells, a first impurity layer formed in the vicinity of the depletion region of at least one but not more than two of the first, second, and third regions, and, a second impurity layer deeper than the first impurity layer and formed in the region(s) of the substrate in which the first impurity layer is not formed. The first and second wells are preferably of opposite conductivity types, e.g., the first well is an N-well and the second well is a P-well.

In a first preferred embodiment of the CMOS device, the first impurity layer is formed in the third region only. In a second preferred embodiment of the CMOS device, the first impurity layer is formed in the first and second regions only. In a third preferred embodiment of the CMOS device, the first impurity layer is formed in the first and third regions only. In a fourth preferred embodiment of the CMOS device, the first impurity layer is formed in the second region only.

In a fifth preferred embodiment of the CMOS device, the first impurity layer is formed in the second and third regions only. In a sixth preferred embodiment of the CMOS device, the first impurity layer is formed in the first region only.

In all six preferred embodiments, the CMOS device preferably further includes a third impurity layer formed in the channel region of each transistor for adjusting the threshold voltage thereof. The concentration of the first and second impurity layers is preferably lower than that of the third impurity layer and is preferably higher than that of the substrate and wells.

The present invention also encompasses a method for manufacturing a CMOS device, which includes the steps of forming a first insulating layer on a major surface of a semiconductor substrate, removing a first portion of the first insulating layer from a first portion of the major surface of the substrate, forming a second insulating layer on the first portion of the major surface of the substrate and forming a first well in a region of the substrate beneath the second insulating layer, removing either the first or second insulating layer, to thereby leave a remaining insulating layer, and, forming a first impurity layer in a first region of the substrate beneath the remaining insulating layer, and a second impurity layer in a second region of the substrate uncovered by the remaining insulating layer.

The step of forming a first and a second impurity layer is preferably carried out by doping impurities in the entire surface region of said substrate. The first impurity layer is preferably formed to a first depth in the vicinity of the depth of a depletion region of a transistor formed in the first region of said substrate. The method also preferably further includes the step of doping impurities to a depth less than the first depth, in the entire surface region of the resultant structure, to thereby form a third impurity layer.

The concentration of the first and second impurity layers is preferably lower than that of the third impurity layer, and is preferably higher than that of the substrate and first well. The first insulating layer is preferably formed to a thickness of 1,000–2,000 angstroms, the second insulating layer is preferably formed to a thickness of 4,000–6,000 angstroms, and the impurities are preferably doped at an energy level of 400–600 keV.

In a preferred embodiment, the method further includes, after the step of forming a second insulating layer, the steps of removing a second portion of the first insulating layer from a second portion of the major surface of the semiconductor substrate, forming a third insulating layer on the second portion of the major surface of the substrate, and then forming a second well in a second region of the substrate beneath the third insulating layer. The first and second wells are preferably of opposite conductivity types, e.g., the first well is an N-well and the second well is a P-well. The second well may be formed in the first well, or vice versa.

A significant feature of the present invention resides in the fact that the bulk concentration outside the depletion region of a transistor whose punch-through voltage is not desired to be adjusted does not affect the γ value, since the impurities doped to form the first and second impurity layers are doped below the depletion region of the transistors whose punch-through voltage is not desired to be adjusted. In this manner, a first impurity layer is formed to the depth of the depletion region of a transistor(s) requiring a high punch-through voltage, and a second impurity layer is formed to a depth greater than the depth of the depletion region of a transistor (s) which does not require a high punch-through voltage, so that the operating voltage thereof is not affected by back bias.

BRIEF DESCRIPTION OF THE DRAWINGS

These and various other features, objects, and advantages of the present invention will be readily understood with reference to the following detailed description taken in conjunction with the accompanying drawings, in which:

FIGS. 5A–5F are cross-sectional views depicting successive steps of a method for manufacturing the CMOS device in accordance with the third preferred embodiment of the present invention;

DETAILED DESCRIPTION OF THE PREFERRED EMBODIMENTS

Figure 1:
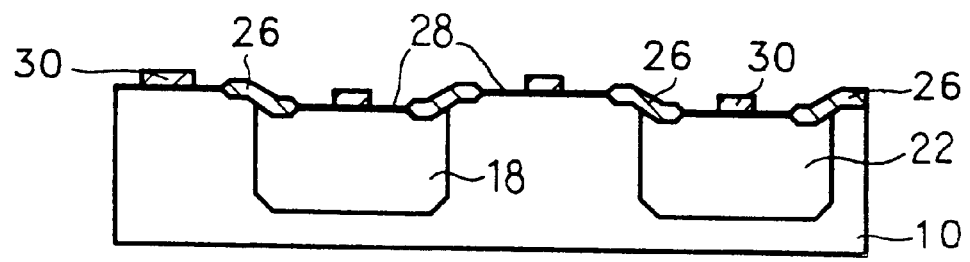
FIG. 1 is a cross-sectional view of a conventional CMOS device.

With reference now to FIGS. 2A–2F, six respective preferred embodiments of a CMOS device constructed in accordance with the present invention will be described. In this connection, the same reference numerals are used throughout to designate like elements thereof, since the CMOS device of each of these preferred embodiments includes common elements, as will now be described. More particularly, the CMOS device of each embodiment includes an N-well 18 formed in a first region of a P-type semiconductor substrate 10, a P-well 22 formed in a second region of the substrate 10, field oxide layer regions 26 formed at the respective junctions of the wells 18, 22 and a third region of the substrate 10 in which no wells are formed, a gate oxide layer 28 formed on the entire surface of the substrate 10, and gate electrodes 30 formed on the gate oxide layer 28 above each of the first, second, and third regions, respectively. The gate electrodes 30 serve as the gate electrode of respective transistors formed in the first, second, and third regions of the substrate, respectively. In this regard, the source and drain regions of the respective transistors are not shown in order to faciliate ease of illustration and description of the other features of the present invention. However, since the basic methodology for forming the source and drain regions of the transistors is notoriously well-known in the art, no description thereof is deemed necessary for a full and clear understanding of the present invention. As is also notoriously well-known in the art, each of the first, second, and third regions of the substrate 10 has an intrinsic depletion region associated therewith.

Figure 2A:
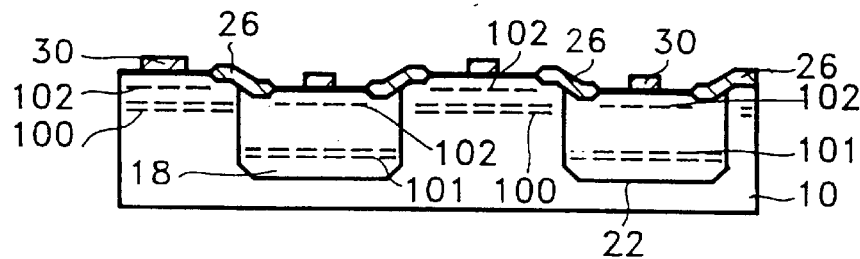
FIGS. 2A–2F are cross-sectional views of respective CMOS devices manufactured in accordance with six respective preferred embodiments of the present invention.

With particular reference now to FIG. 2A, a CMOS device made in accordance with a first preferred embodiment of the present invention will now be described. More particularly, a first impurity layer 100 is formed in the vicinity of the depletion region of the third region of the substrate 10, i.e., outside of the wells 18 and 22. A second impurity layer 101 is formed in the first and second regions of the substrate 10 (i.e., in the N-well 18 and P-well 22) to a depth greater than that of the first impurity layer 100. A third impurity layer 102 is formed in the transistor channel region of each of the first, second, and third regions of the substrate 10, to a depth shallower than that of the first impurity layer 100, in order to adjust the channel threshold voltage of the respective transistors formed in the first, second, and third regions of the substrate 10.

Preferably, the first and second impurity layers 100, 101, respectively, each have a concentration lower than that of the third impurity layer 102, but higher than that of the substrate 10 and wells 18, 22. Preferably, the concentration of the first and second impurity layers 100, 101 is in the range of 1.0–5.0E11 ions/cm$^2$. The first impurity layer 100 preferably extends to the same depth as does the depletion region of the third region of the substrate 10, e.g., to a depth of 0.8–1.5 $\mu$m from the surface of the substrate 10.

As will be readily evident to those skilled in the art, the first impurity layer 100 serves to increase the punch-through voltage of the transistor formed in the third region of the substrate 10, which requires a high punch-through voltage for reliable and efficient operation thereof.

Figure 2B:
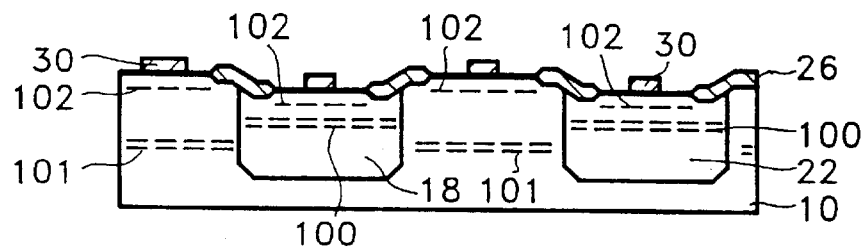

With particular reference now to FIG. 2B, a CMOS device made in accordance with a second preferred embodiment of the present invention will now be described. With this embodiment, the punch-through voltage characteristics of the transistors formed (or to be formed) in the first region of the substrate 10 (i.e., in the N-well 18) and in the second region of the substrate 10 (i.e., in the P-well 22) are controllably adjusted to improve the same. More particularly, the first impurity layer 100 is formed in the N-well 18 and the P-well 22, and the second impurity layer 101 is formed in the third region of the substrate 10, i.e., outside of the wells 18 and 22.

From the foregoing, it will be appreciated by those skilled in the art that the punch-through voltage characteristics of a selected one or more of the transistors formed in the first, second, and third regions of the substrate 10 can be adjusted (increased) by forming the first impurity layer 100 in the region(s) of the substrate 10 in which the selected transistor (s) is (are) formed, and forming the second impurity layer 101 in the region(s) of the substrate 10 in which the non-selected transistor(s) is (are) formed (i.e., in the remaining region(s) of the substrate 10).

Figure 2C:
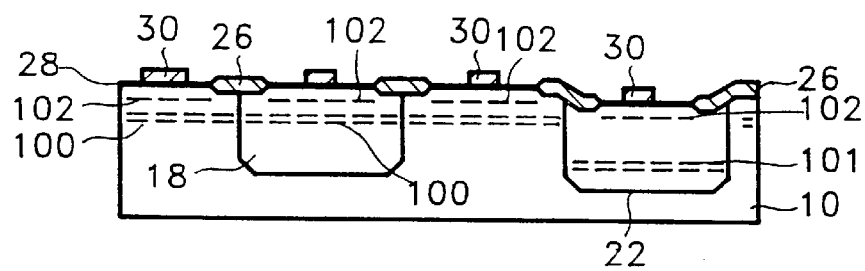
Figure 2D:
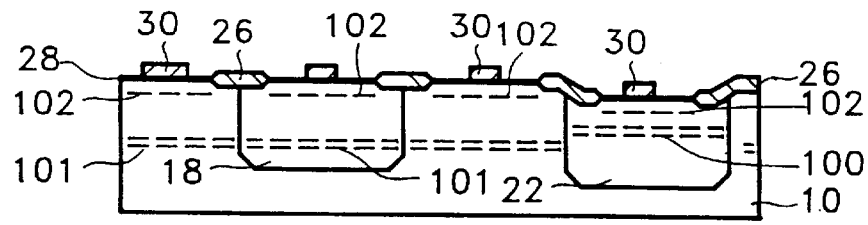
Figure 2E:
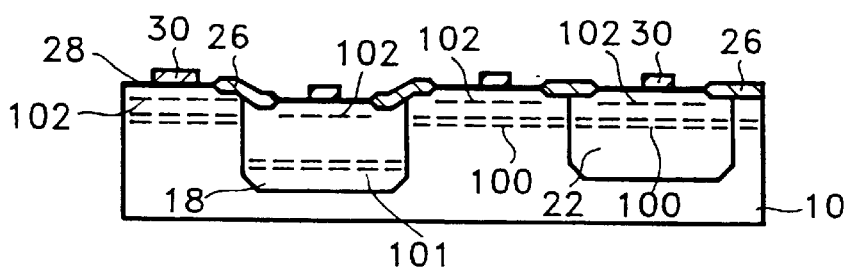
Figure 2F:
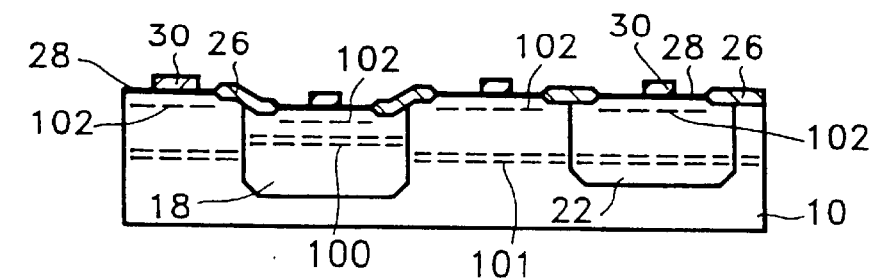

In a similar fashion the CMOS device of the third preferred embodiment of the present invention depicted in FIG. 2C exhibits improved punch-through voltage characteristics of the transistors formed in the N-well 18 and the third region of the substrate 10. With the CMOS device of the fourth preferred embodiment of the present invention, depicted in FIG. 2D, the punch-through voltage characteristics of the transistor formed in the P-well 22 are improved. With the CMOS device of the fifth preferred embodiment of the present invention, depicted in FIG. 2E, the punch-through voltage characteristics of the transistors formed in the P-well 22 and the third region of the substrate 10 are improved. With the CMOS device of the sixth preferred embodiment of the present invention, depicted in FIG. 2F, the punch-through voltage characteristics of the transistor formed in the N-well 18 are improved.

With reference now to FIGS. 3A–3F, a method for manufacturing the CMOS device in accordance with the first preferred embodiment of the present invention (depicted in FIG. 2A) will now be described.

Figure 3A:
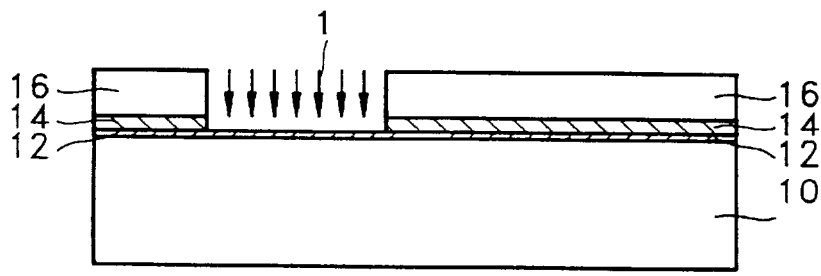
FIGS. 3A–3F are cross-sectional views depicting successive steps of a method for manufacturing the CMOS device in accordance with the first preferred embodiment of the present invention.

With particular reference now to FIG. 3A, a pad oxide layer 12 is formed on the surface of the semiconductor substrate 10, and a first insulating layer 14 is formed on the pad oxide layer 12. A photoresist layer 16 is formed on the first insulating layer 14, and a window 1 is formed in the photoresist layer 16 and the corresponding underlying portion of the first insulating layer 14, e.g., by a standard photolithographic etching process, to thereby expose the first region of the semiconductor substrate 10. Thereafter, the first region of the substrate 10 is doped with N-type impurities, e.g., by using an ion-implantation process.

Although not limited to the present invention, the semiconductor substrate 10 preferably has a specific resistance of 18 $\Omega$/cm and is doped with P-type impurities. The pad oxide layer 12 serves as a buffer oxide layer and is preferably formed to a thickness of 500–1,000 angstroms. The first insulating layer 14 is preferably a nitride layer, and is preferably formed to a thickness of 1,000–2,000 angstroms, depending upon the energy used in implanting the N-type impurities into the first region of the substrate 10, and on the depth of the intrinsic depletion region of the first region of the substrate 10. Preferably, the N-type impurities are phosphorus ions which are ion-implanted at an energy of about 100 KeV and a concentration of 1.8E13 ions/cm$^2$, using the photolithographically patterned photoresist layer 16 as an ion-implantation mask.

Figure 3B:
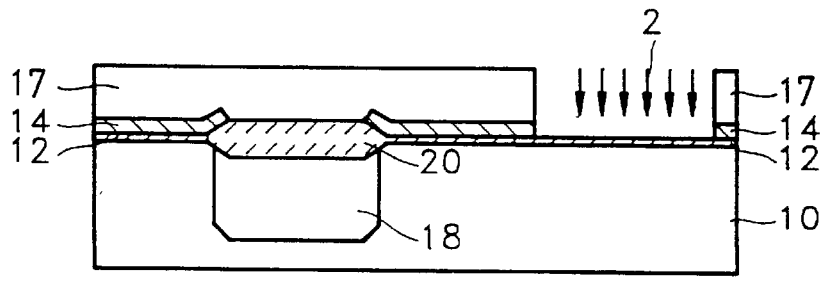

With particular reference now to FIG. 3B, a second insulating layer 20 is formed on the first region of the substrate 10, and, preferably simultaneously therewith, the N-well 18 is formed by a thermal well drive-in process, by which the ion-implanted N-type impurities are diffused into the first region of the substrate 10 to a predetermined depth. The second insulating layer 20 is preferably formed to a thickness of 4,000–6,000 angstroms. The thermal drive-in process is preferably carried out at 1150° C. for about eight hours.

Next, as shown in FIG. 3B, the photoresist layer 16 is removed, and a photoresist layer 17 is formed on the resultant structure. A window 2 is formed in the photoresist layer 17, and in the corresponding, underlying portion of the first insulating layer 14, e.g., by a standard photolithographic etching process, in spaced-apart relationship to the N-well 18, to thereby expose the second region of the semiconductor substrate 10. Thereafter, the second region of the substrate 10 is doped with P-type impurities, e.g., by using an ion-implantation process. Preferably, the P-type impurities are boron ions which are ion-implanted at an energy of about 80 KeV, and at a concentration of 2.1E12 ions/cm$^2$.

Figure 3C:
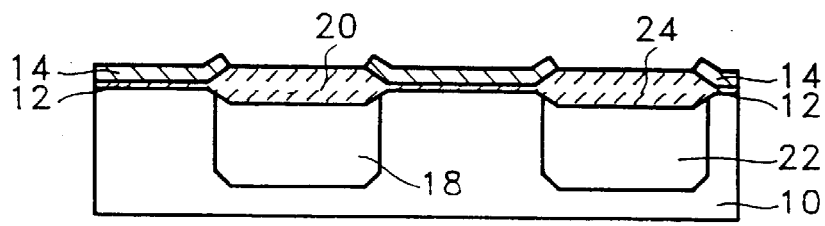

With particular reference now to FIG. 3C, a third insulating layer 24 is formed on the second region of the substrate 10, and, preferably simultaneously therewith, the P-well 22 is formed by a thermal well drive-in process, by which the ion-implanted P-type impurities are diffused into the second region of the substrate 10 to a predetermined depth. Preferably, this thermal well drive-in process is carried out at a temperature of 1150° C. for about eight hours.

Although the N-well 18 and P-well 22 are formed by respective, separate ion-implantation, oxidation, and thermal well drive in processes, it should be clearly understood that this is not limited by to the present invention. For example, after the ion-implantation steps are separately carried out, a single thermal well drive-in process can be performed to simultaneously complete the N-well 18 and the P-well 22 by thermal diffusion of the respective ion-implanated N-type and P-type impurities into the first and second region respectively, of the semiconductor substrate 10. In general, the specific method used for forming the N-well 18 and P-well 22 is not limited by to the present invention.

Figure 3D:
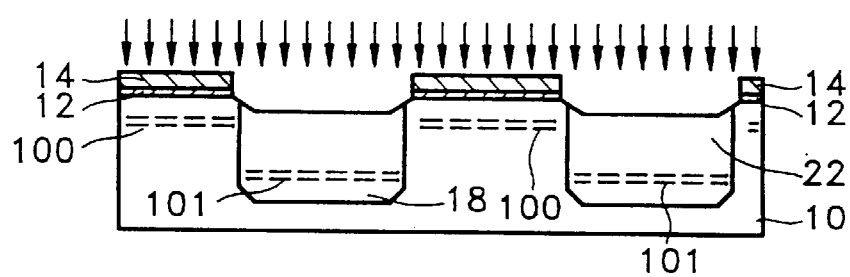

With particular reference now to FIG. 3D, the second and third insulating layers 20, 24, respectively, are removed, and impurities (either P-type or N-type impurities, depending on the desired threshold voltage characteristics of the transistors) are doped into the entire surface of the resultant structure, e.g., by using an ion-implantation process, preferably at an energy of 400–800 KeV, to thereby form a first impurity layer 100 in the third region of the substrate 10, i.e., outside of the wells 18 and 22, and a second impurity layer 101 in the first and second regions of the substrate 10, i.e., in the N-well 18 and the P-well 22. Even though the first and second impurity layers 100, 101, respectively, are preferably simultaneously formed by using an ion-implantation process carred out at the same energy level, because of the presence of the pad oxide layer 12 and the first insulating layer 14 above the third region of the substrate 10, the first impurity layer 100 is implanted to a depth less than that of the second impurity layer 101. Preferably, the first impurity layer 100 is formed to the same depth as that of the intrinsic depletion region of the third region of the substrate 10, i.e., about 0.8–1.5 $\mu$m from the surface of the substrate 10. The dosage of the impurities ion-implanted for forming the first and second impurity layers 100, 101 is preferably lower than the dosage used for adjusting the threshold voltage of the transistors formed in the first, second, and third regions of the substrate 10 (in a subsequent step, as will be explained below), but higher than that of the substrate 10, e.g., 1.0–5.0E11 ions/cm$^2$.

Figure 3E:
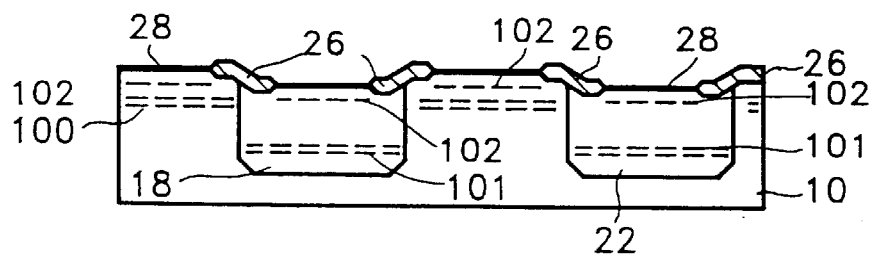

With particular reference now to FIG. 3E, the pad oxide layer 12 and the first insulating layer 14 are both removed, and separate field oxide layer regions 26 are formed on the surface of the resultant structure across the junctions of the N-well 18 and the third region of the substrate 10, and at the junctions of the P-well 22 and the third region of the substrate 10. Next, a third impurity layer 102 is formed by doping impurities, e.g., ion-implanting P-type impurities, into the entire surface region of the resultant structure, i.e., in the first, second, and third regions of the substrate 10. Preferably, boron ions are ion-implanted at an energy and dosage sufficient to adjust the threshold voltage of the transistors to be formed in the first, second, and third regions of the substrate 10 to a desired level, e.g., at an energy of about 30 KeV and at a dosage of 1.7E12 ions/cm$^2$.

Figure 3F:
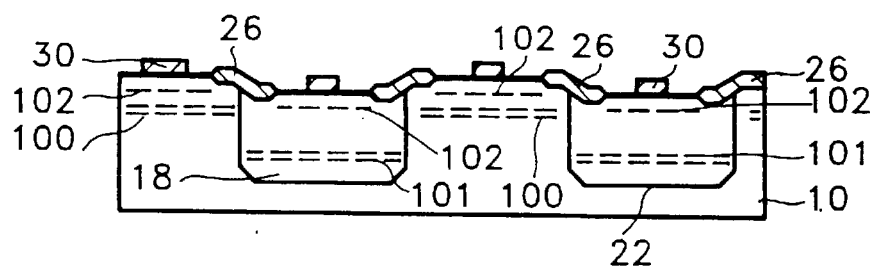
Figure 4A:
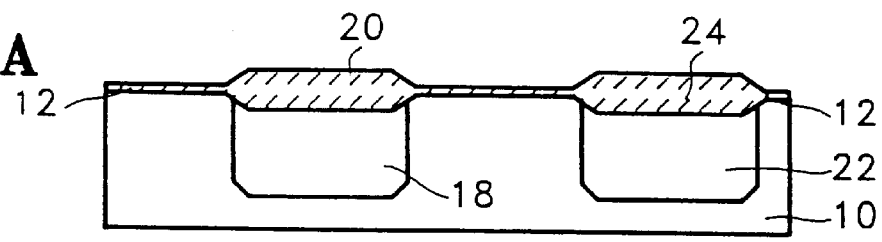
FIGS. 4A–4D are cross-sectional views depicting successive steps of a method for manufacturing the CMOS device in accordance with the second preferred embodiment of the present invention.
Figure 4B:
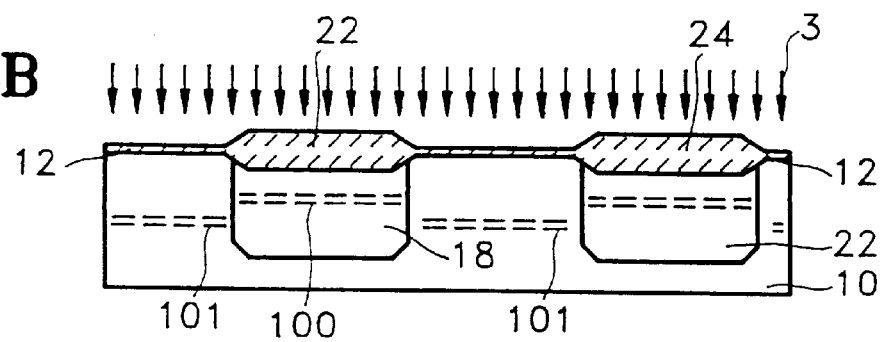
Figure 4C:
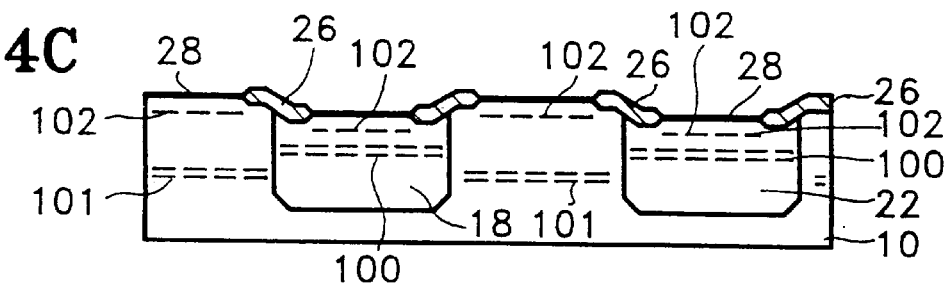
Figure 4D:
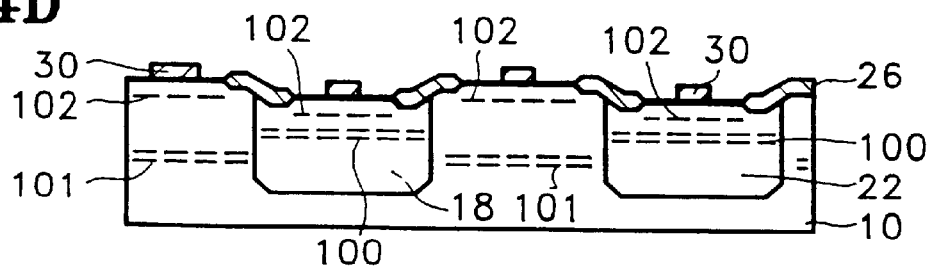

Then, a gate oxide layer 28 is formed on the surface of the first, second, and third regions of the substrate 10, e.g., to a thickness of about 120 angstroms. Next, as can be seen in FIG. 3F, the gate electrodes 30 of the respective transistors to be formed in the first, second, and third regions are formed, e.g., by a standard metal deposition and photolithographic etching process well-known to those skilled in the pertinent art.

From the foregoing, it will be appreciated by those skilled in the art that with the above-described first preferred embodiment of the method of the present invention, the first impurity layer 100 is formed to the same depth as that of the source and drain regions of the transistor(s) to be formed in the third region of the substrate 10, i.e., outside of the wells 18 and 22, and the second impurity layer 102 is formed to a depth greater than that of (beneath) the source and drain regions of the transistors to be formed in the N-well 18 and P-well 22. In this way, the transistor(s) formed in the third region of the substrate 10, i.e., outside of the wells 18 and 22, is made to have a high punch-through voltage, and the transistors formed in the wells 18, 22, respectively, are made to have an operating voltage which is not affected by the bulk concentration of the high-concentration impurity layer. Thus, a transistor formed in the third region of the substrate 10 can be made to have a selectively higher punch-through voltage than the transistors formed in the wells 18, 22 (i.e., first and second regions of the substrate 10), without the need for additional, separate mask process steps.

With reference now to FIGS. 4A–4D, a method for manufacturing the CMOS device in accordance with the second preferred embodiment of the present invention (depicted in FIG. 2B) will now be described. In general, the method of the second embodiment is used to increase the punch-through voltage of the transistors formed in the wells 18 and 22, while the method of the first embodiment was for increasing the punch-through voltage of the transistor formed in the substrate. The method of the second embodiment differs from that of the first embodiment only in that, with this embodiment, the first and second impurity layers 100, 101, respectively, are formed after removing the first insulating layer 14 and before removing the second and third insulating layers 20, 24.

With reference now to FIGS. 5A–5F, a method for manufacturing the CMOS device in accordance with the third preferred embodiment of the present invention (depicted in FIG. 2C) will now be described. In general, the method of the third embodiment is used to increase the punch-through voltage of the transistors formed in the N-well 18 and third region of the substrate 10. More particularly, a pad oxide layer 12 and first insulating layer 14 are sequentially formed on the surface of the semiconductor substrate 10 (FIG. 5A), the P-well 22 and the third insulating layer 24 are formed (FIG. 5B), the N-well 18 is formed (FIGS. 5B–5C), and then the first and second impurity layers 100, 101, respectively, (FIG. 5D) are simultaneously formed. The remaining steps depicted in FIGS. 5E–5F are essentially the same as those depicted in FIGS. 3E–3F and described previously in connection with the description of the first preferred embodiment of the method of the present invention.

Figure 6A:
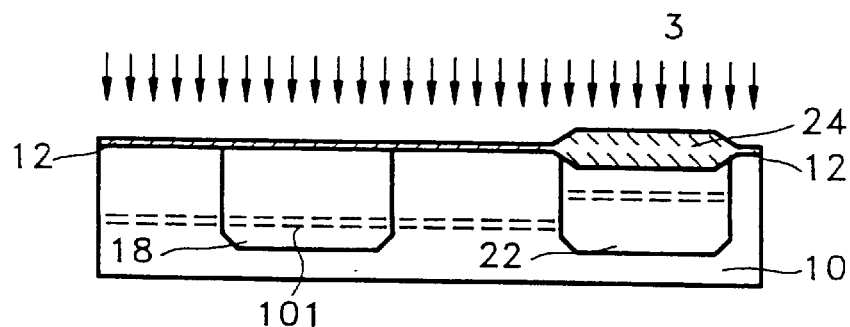
FIGS. 6A–6C are cross-sectional views depicting successive steps of a method for manufacturing the CMOS device in accordance with the fourth preferred embodiment of the present invention.
Figure 6B:
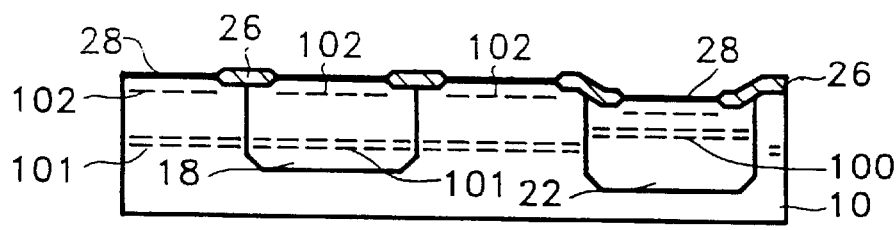
Figure 6C:
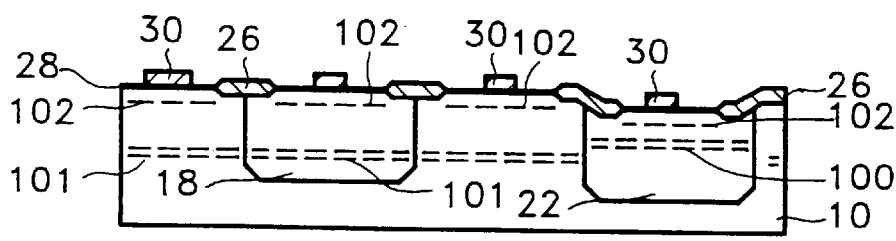
Figure 7A:
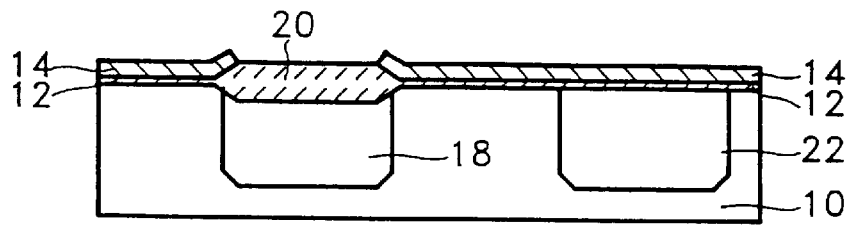
FIGS. 7A–7D are cross-sectional views depicting successive steps of a method for manufacturing the CMOS device in accordance with the fifth preferred embodiment of the present invention; and, FIGS. 8A–8C are cross-sectional views depicting successive steps of a method for manufacturing the CMOS device in accordance with the sixth preferred embodiment of the present invention.
Figure 7B:
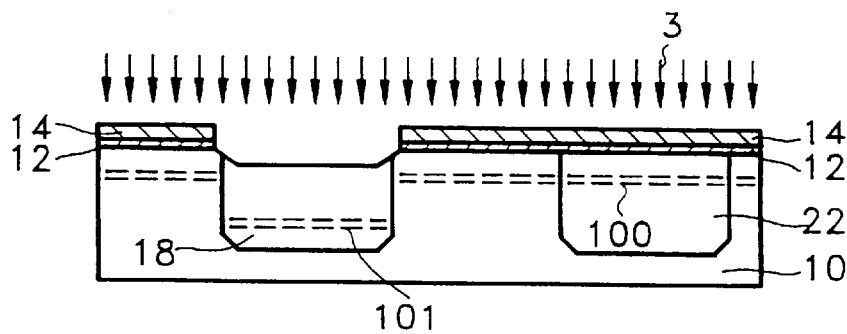
Figure 7C:
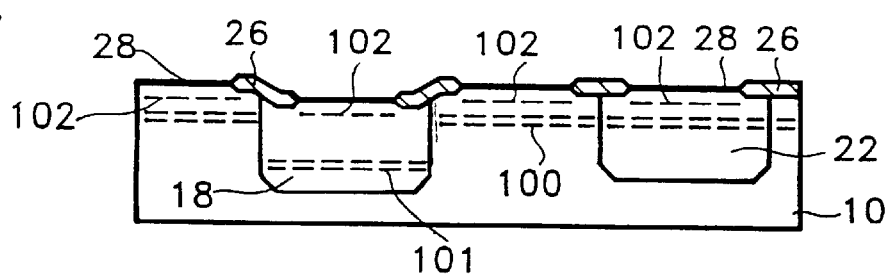
Figure 7D:
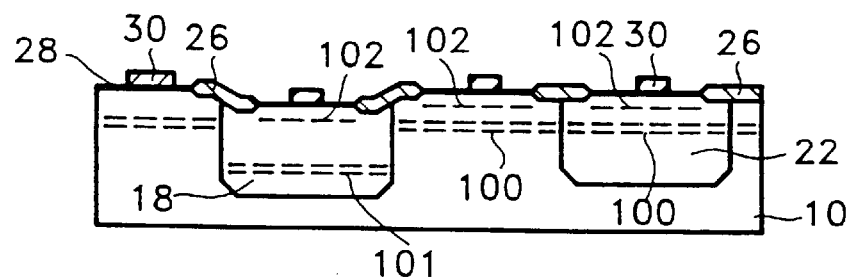

With reference now to FIGS. 6A–6C, a method for manufacturing the CMOS device in accordance with the fourth preferred embodiment of the present invention (depicted in FIG. 2D) will now be described. In general, the method of the fourth embodiment is used to increase the punch-through voltage of the transistor formed in the P-well 22. In contrast to the third preferred embodiment of the method of the present invention depicted in FIGS. 5A–5F in which only the portion of the insulating layer 14 on the P-well 22 is removed, with this embodiment, the portions of the insulating layer 14 on the N-well 18 and third region of the substrate 10 are also removed, and the third insulating layer 24 formed on the P-well 22 is not removed prior to the step of forming the first and second impurity layers 100, 101, respectively.

With reference now to FIGS. 7A–7D, a method for manufacturing the CMOS device in accordance with the fifth preferred embodiment of the present invention (depicted in FIG. 2E) will now be described. In general, the method of the fifth embodiment is used to increase the punch-through voltage of the transistors formed in the P-well 22 and the third region of the substrate 10. In contrast to the third preferred embodiment of the method of the present invention depicted in FIGS. 5A–5F in which only the portion of the insulating layer 14 on the P-well 22 is removed, with this embodiment, only the portion of the insulating layer 14 on the N-well 18 is removed prior to the step of forming the first and second impurity layers 100, 101, respectively.

Figure 8A:
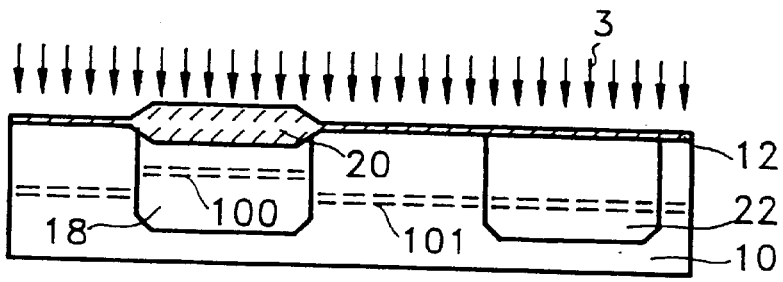
Figure 8B:
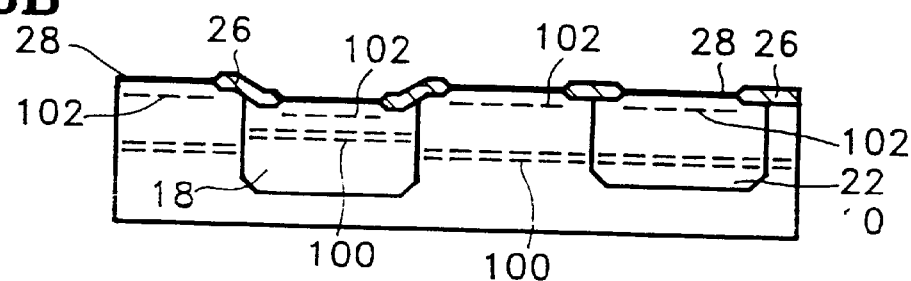
Figure 8C:
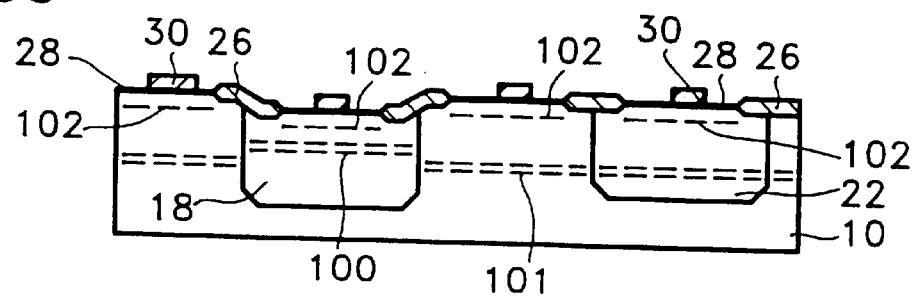

With reference now to FIGS. 8A–8C, a method for manufacturing the CMOS device in accordance with the sixth preferred embodiment of the present invention (depicted in FIG. 2F) will now be described. In general, the method of the sixth embodiment is used to increase the punch-through voltage of the transistor formed in the N-well 18. In contrast to the third preferred embodiment of the method of the present invention depicted in FIGS. 5A–5F in which only the portion of the insulating layer 14 on the P-well 22 is removed, with this embodiment, the portion of the insulating layer 14 on the N-well 18 and third region of the substrate 10 are removed, and the second insulating layer 20 is formed on the N-well 18 (rather than the third insulating layer 24 being formed on the P-well 22), prior to the step of forming the first and second impurity layers 100, 101, respectively.

Although several preferred embodiments of the present invention have been described in detail, it should be clearly understood that many variations and/or modifications of the basic inventive concepts which may appear to those skilled in the art will still fall within the spirit and scope of the present invention as defined in the appended claims.

What is claimed is:

1. A method for manufacturing a CMOS device, comprising the steps of:

forming a first insulating layer on a major surface of a semiconductor substrate;

removing a first portion of said first insulating layer from a first portion of said major surface of said substrate;

forming a second insulating layer on said first portion of said major surface of said substrate and forming a first well in a region of said substrate beneath said second insulating layer;

removing either said first or second insulating layer, to thereby leave a remaining insulating layer; and, forming a first impurity layer in a first region of said substrate beneath said remaining insulating layer, and a second impurity layer in a second region of said substrate uncovered by said remaining insulating layer.

2. The method as set forth in claim 1, wherein the step of forming a first and a second impurity layer is carried out by doping impurities in the entire surface region of said substrate.

3. The method as set forth in claim 2, wherein said first impurity layer is formed to a first depth in the vicinity of the depth of a depletion region of a transistor formed in said first region of said substrate.

4. The method as set forth in claim 3, further comprising the step of forming a third impurity layer by doping impurities in said entire surface region of said substrate to a second depth shallower than said first depth.

5. The method as set forth in claim 4, wherein the concentration of said first and second impurity layers is lower than that of said third impurity layer and is higher than that of said semiconductor substrate and said first well.

6. The method as set forth in claim 2, wherein said first insulating layer is formed to a thickness of 1,000–2,000 angstroms, and said second insulating layer is formed to a thickness of 4,000–6,000 angstroms.

7. The method as set forth in claim 1, wherein the step of forming said first and second impurity layers is carried out by doping impurities in the entire surface region of said semiconductor substrate at an energy level of 400 KeV–800 KeV.

8. The method as set forth in claim 2, further comprising, after the step of forming a second insulating layer and prior to the step of removing either said first or second insulating layer, the steps of:

removing a second portion of said first insulating layer from a second portion of said major surface of said semiconductor substrate;

forming a second insulating layer on said second portion of said major surface of said substrate; and, forming a second well in a region of said substrate beneath said second insulating layer.

9. The method as set forth in claim 8, wherein said first well is an N-well and said second well is a P-well.

10. The method as set forth in claim 8, wherein said first well is formed in said second well.

* * * * *